(12) United States Patent
Arroyo Camejo et al.

(10) Patent No.: US 11,933,870 B2
(45) Date of Patent: Mar. 19, 2024

(54) CONTRAST AND/OR SYSTEM INDEPENDENT MOTION DETECTION FOR MAGNETIC RESONANCE IMAGING

(71) Applicant: Siemens Healthineers AG, Forchheim (DE)

(72) Inventors: Silvia Bettina Arroyo Camejo, Nuremberg (DE); Benjamin L. Odry, West New York, NJ (US); Xiao Chen, Princeton, NJ (US); Mariappan S. Nadar, Plainsboro, NJ (US)

(73) Assignee: Siemens Healthineers AG, Forchheim (DE)

(*) Notice: Subject to any disclaimer, the term of this patent is extended or adjusted under 35 U.S.C. 154(b) by 629 days.

(21) Appl. No.: 16/445,784

(22) Filed: Jun. 19, 2019

(65) Prior Publication Data

US 2020/0400769 A1    Dec. 24, 2020

(51) Int. Cl.
*G01R 33/565* (2006.01)
*G01R 33/56* (2006.01)
*G06T 7/246* (2017.01)
*G06T 11/00* (2006.01)

(52) U.S. Cl.
CPC ... *G01R 33/56509* (2013.01); *G01R 33/5602* (2013.01); *G01R 33/5608* (2013.01); *G06T 7/246* (2017.01); *G06T 11/008* (2013.01); *G06T 2207/10088* (2013.01); *G06T 2207/20081* (2013.01); *G06T 2207/20084* (2013.01)

(58) Field of Classification Search
CPC .......... G01R 33/56509; G01R 33/5608; G01R 33/5602; G06T 11/008; G06T 7/246; G06T 2207/10088; G06T 2207/20084; G06T 2207/20081
See application file for complete search history.

(56) References Cited

U.S. PATENT DOCUMENTS

| | | | |
|---|---|---|---|
| 2017/0372155 A1* | 12/2017 | Odry | G16H 50/20 |
| 2018/0232878 A1 | 8/2018 | Braun | |
| 2019/0046068 A1* | 2/2019 | Ceccaldi | G06V 10/764 |
| 2019/0049540 A1* | 2/2019 | Odry | G01R 33/543 |
| 2019/0318474 A1* | 10/2019 | Han | A61N 5/103 |
| 2019/0377047 A1* | 12/2019 | Chen | G01R 33/4818 |
| 2020/0034948 A1* | 1/2020 | Park | G06N 3/0481 |
| 2020/0051239 A1* | 2/2020 | Braun | G06K 9/6269 |

OTHER PUBLICATIONS

Braun et al. "Wasserstein GAN for Motion Artifact Reduction of MR images" Published Jun. 1, 2018. ISMRM (Year: 2018).*

(Continued)

*Primary Examiner* — Rishi R Patel (57) ABSTRACT

For detecting motion in MR imaging, a regression model, such as a convolutional neural network, is machine trained. To generalize to MR imagers, MR contrasts, or other differences in MR image generation, the regression model is trained adversarially. The discriminator for adversarial training discriminates between classes of the variation source (e.g., type of MR imager or type of contrast) based on values of features learned in the regression model for detecting motion. By adversarial training, the regression model learns features that are less susceptible or invariant to variation in image source.

11 Claims, 4 Drawing Sheets

(56) References Cited

OTHER PUBLICATIONS

ISMRM "2018 Call for Abstracts" Published 2017. ISMRM (Year: 2017).*

Tao, Qian, et al. "Deep learning-based method for fully automatic quantification of left ventricle function from cine MR images: a multivendor, multicenter study." Radiology 290.1 Published Oct. 9, 2018: 81-88. (Year: 2018).*

Remedios, Samuel, et al. "Classifying magnetic resonance image modalities with convolutional neural networks." arXiv preprint arXiv:1804.05764 (2018). (Year: 2018).*

Arroyo-Camejo, Silvia, et al. "Towards Contrast-Independent Automated Motion Detection Using 2D Adversarial DenseNets" Proc ISMRM. vol. 27. May 2019. (Year: 2019).*

Braun, S., Chen, X., Odry, B., Mailhe, B., Nadar, MS., 2018. "Motion Detection and Quality Assessment of MR images with Deep Convolutional DenseNets" Proc. Joint Annual Meeting ISMRM-ESMRMB. Accessed Mar. 6, 2019. pp. 1-3.

Lorch, Benedikt, et al. "Automated detection of motion artefacts in MR imaging using decision forests." Journal of medical engineering 2017 (2017). pp. 1-10.

Mortamet, Bénédicte, et al. "Automatic quality assessment in structural brain magnetic resonance imaging." Magnetic Resonance in Medicine: An Official Journal of the International Society for Magnetic Resonance in Medicine 62.2 (2009): 365-372.

U.S. Appl. No. 16/002,447, filed Jun. 7, 2018.
U.S. Appl. No. 16/162,559, filed Oct. 17, 2018.
U.S. Appl. No. 16/214,339, filed Dec. 10, 2018.

Wallace, Tess E., et al. "Head motion measurement and correction using FID navigators." Magnetic resonance in medicine 81.1 (Jan. 2019): pp. 1-17.

* cited by examiner

CONTRAST AND/OR SYSTEM INDEPENDENT MOTION DETECTION FOR MAGNETIC RESONANCE IMAGING

BACKGROUND

The present embodiments relate to detecting motion in magnetic resonance (MR) imaging. Patient motion during MR scanning is one common source of MR artifacts and may lead to blurring, ghosting and distortion in MR images. To ensure sufficient quality of the acquired data, quality assessment is implemented in the imaging pipeline. A scoring system assesses quality and helps determine whether enough significant clinical value may be extracted and therefore lead to correct diagnosis. Providing automated quality control is particularly challenging in MR imaging due to the variation in MR imagers and scanning parameters that lead to a significant variance in MR image appearance (e.g., tissue specific relative brightness, noise level, field of view, and scanner specifics).

Radio frequency-assisted motion detection may be performed by continuously monitoring the free induction decay signal of the volume of interest but requires a modification of the pulse sequence and creates a scan time overhead. Purely image-based motion detection is conventionally performed by analyzing statistics of the noise in the image background but requires a significant background area or volume in the recorded image. Approaches based on decision trees have been explored but exhibited only limited classification accuracy. Motion detection with generic convolutional neural networks show promising classification results but do not generalize to varying MRI contrasts or MR imagers.

SUMMARY

By way of introduction, the preferred embodiments described below include methods, systems, and instructions in non-transitory computer readable media for detecting motion in MR imaging. A regression model, such as a convolutional neural network, is machine trained to detect motion. To generalize to MR imagers, contrasts, or other differences in MR image generation, the regression model is trained adversarially. The discriminator for adversarial training discriminates between classes of the variation source (e.g., type of MR imager or type of MR contrast) based on values of features learned in the regression model for detecting motion. By adversarial training, the regression model learns features that are less susceptible or invariant to variation in image source.

In a first aspect, a method is provided for detecting motion for a magnetic resonance system. A magnetic resonance representation of a patient is reconstructed from a magnetic resonance scan of the patient. A level of the motion is determined by a machine-learned network in response to input of the magnetic resonance representation to the machine-learned network. The machine-learned network was trained adversarially with a discriminator where the discriminator was trained to output contrast and/or scanner class. The level of the motion is displayed with an image from the magnetic resonance representation.

In one embodiment, the reconstruction includes generating a two-dimensional image as the magnetic resonance representation. The two-dimensional image is displayed.

In some embodiments, the magnetic resonance representation is generated as a T1 or T2 weighted contrast image. The machine-learned network was adversarially trained with the discriminator where the discriminator was trained to identify between T1 and T2 classes. In other embodiments, the magnetic resonance representation is generated with a first main magnet field strength. The machine-learned network was trained adversarially with the discriminator where the discriminator was trained to identify between field strength classes including the first main magnet field strength. In yet other embodiments, the magnetic resonance representation is generated with a first class of magnetic resonance scanner. The machine-learned network was trained adversarially with the discriminator where the discriminator was trained to identify between different classes of magnetic resonance scanners including the first class.

The machine-learned network may be of various architectures, such as a deep convolutional neural network. For example, the deep convolutional neural network includes a convolutional layer and a pooling layer. As another example, the neural network is a DenseNet. The deep convolutional neural network was trained with the discriminator connected to receive features of the deep convolutional neural network from, e.g., a layer before one of the pooling layers.

Various training strategies may have been used. The machine-learned network and the discriminator may have been trained with a combined loss, jointly trained, or trained in an end-to-end manner.

In a second aspect, a method is provided for machine learning to detect motion in images of a magnetic resonance system. A regression model is defined to be configured to output a motion severity score for a magnetic resonance image, and a discriminator is defined to be configured to classify the magnetic resonance image based on one or more features of the regression model. A machine uses deep learning to train the regression model and the discriminator. The learned regression model is stored.

In one embodiment, the regression model is defined as a first convolutional neural network, and the discriminator is defined as a second convolutional neural network. For example, the first convolutional neural network is defined as a first DenseNet, and the second convolutional neural network is defined as a second DenseNet.

In some embodiments, the discriminator is defined to receive one or more features from one or more of the layers before a pooling layer.

The discriminator is defined to classify between MR contrasts, MR scanners, or classes of a source of the MR image separate from the motion severity score.

In one embodiment, a combination of a loss for the motion severity score of the regression model and a loss for the classification of the discriminator is used in training.

In a third aspect, a magnetic resonance system is provided for motion detection independent of scanner or contrast. An MR imager is configured to generate magnetic resonance data representing a patient. An image processor is configured to detect motion by input of the magnetic resonance data to a machine-learned model where the machine-learned model was trained adversarially based on image class. A display is configured to display information based on the detected motion.

In one embodiment, the machine-learned model is a convolutional neural network having been trained with a discriminator receiving features from within the convolutional neural network.

In some embodiments, the image class is by type of MR contrast and/or type of MR scanner, the MR imager being one of a plurality of types of MR scanners.

The present invention is defined by the following claims, and nothing in this section should be taken as a limitation on those claims. Embodiments or features of one type of claim (e.g., method or system) may be used in the other type of claim (e.g., system or method). Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Motion assessment of MR images is provided via deep learning. Motion artifact is used in the examples herein. In other embodiments, the severity of other MR artifacts is determined, such as chemical shift or Eddy current.

For an automated image quality assessment to perform efficaciously and specifically in MR, the assessment should handle various MR contrast, scanners, or other image source variation. An MRI contrast-independent and scanner-independent quality assessment is provided by including a discriminator of image class in training a generator for motion detection.

In one embodiment, a unified, domain-adapted deep learning routine provides automated image motion assessment in MR imaging (e.g., brain) scans for more than one MR image contrast. MR imaging contrast and/or scanner-independent performance is enforced in the network model using adversarial training. Based on discriminator classification for the source of variation using features from the generator, the adversarial training approach enforces the motion detection network to learn generalized, MRI contrast-independent and scanner-independent features, from which the motion severity score is determined. This allows the motion detection routine to provide quality control for a broad range of MR image contrast and perform robustly on varying scanners. While the generic domain-adversarial approach using generative adversarial networks (GANs) or Wasserman GANs (WGANs) is per construction limited to a generalization from one image class to another, the network for contrast and/or scanner independent generalizes well to an arbitrary number of image classes (e.g., number of MR contrasts and/or number of types of scanners). Since MR imaging possesses a multitude of scanning parameters and thus gives rise to a vast spectrum of image appearances, this independence provides for a broader range of application of motion detection.

Figure 1:
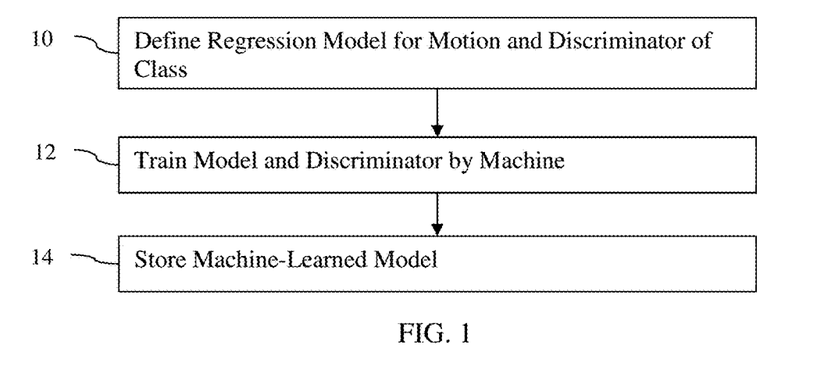
FIG. 1 is a flow chart diagram of one embodiment of creating a method for detecting motion for a magnetic resonance system.

FIG. 1 is a flow chart diagram of one embodiment of a method for machine learning to detect motion in images of an MR system. Machine learning is used to determine motion artifact for an MR system. The machine learns to indicate the severity of the motion artifact regardless of the particular patient using a particular contrast or combination of contrasts and a particular scanner. Using a discriminator in training, the training to generate the level of motion artifact may be more independent of the contrast, scanner, or other variation in the MR image source.

The method is implemented by a machine, such as a computer, workstation, server, or other processing component, with access to a database of hundreds or thousands of examples of MR representations (e.g., three-dimensional (3D) reconstruction, multi-slice imaging data, or two-dimensional (2D) images). The quality (e.g., motion level) and class membership (e.g., type of contrast and/or type of scanner) of each example MR representation is known or provided as ground truth. The machine learns to determine the quality using the examples and corresponding ground truths.

The acts are performed in the order shown (numeric or top-to-bottom), but other orders may be used. Additional, fewer, or different acts may be provided. For example, act 14 is not provided. As another example, acts for creating the training data and/or for application of the machine-trained model are included (see FIG. 6).

In act 10, a user interface and processor are used to define a regression model and a discriminator. The regression model is configured by architecture design to output a motion severity score for an MR image. The discriminator is configured by architecture design to classify the source of the MR image based on one or more features of the regression model. The arrangement, including layers, connections, nodes, convolution kernels, and/or other learnable parameters of the models to apply to machine learning are defined.

MR image is used to indicate any MR representation. The MR image is from data from MR scanning of the patient or phantom and/or is from simulation of MR scanning or combinations of real recorded MR data and simulation (e.g., real recorded, motion artifact-free MR image subject to motion artifact synthesis by simulation). The data is in the image domain, such as after Fourier transform is applied to k-space data. The MR image may be from any point along the MR processing path so may be scalar values before mapping to colors or conversion to the display format or may be a previously displayed image in a display format (e.g., RGB values in a Cartesian coordinate format). The MR image may represent a 2D or 3D distribution of measurements (e.g., MR contrast such as T1 or T2). Depending on the pulse sequence, the MR image represents one of many different MR contrasts. The samples of the training data are from various image sources (e.g., different patients, MR scanners, MR contrasts, software, scanning configurations, image processing, and/or other image sources resulting in image variation).

Any machine learning may be used. In one embodiment, deep learning is used. Using a piecewise-differentiable function or other deep learning function, the machine trains a network to output a score in response to an input image. Support vector machine, Bayesian network, probabilistic boosting tree, neural network, sparse auto-encoding classifier, or other now known or later developed machine learning may be used. Any semi-supervised, supervised, or unsupervised learning may be used. Hierarchal, cascade, or other approaches may be used.

In one embodiment, a neural network (e.g., deep neural network) is used as the architecture. Other deep learned, sparse auto-encoding classifiers may be trained and applied. The machine training learns the features to use and how to classify given the learned feature vector. A deep neural network is trained with a loss to obtain optimal network parameters. The difference between the ground truth or known scores for the training images (e.g., examples of MR representations) and the predictions by the network is minimized.

The network is to be trained with training data. Samples of input data with ground truth are used to learn to classify the score. For deep learning, the classifier learns the features of the input data to extract from the training data. Alternatively, the features, at least for the input, are manually programmed, such as filtering the scan data and inputting the results of the filtering. The training relates the input data to the classification through one or more layers. One layer may relate feature values to the class. For deep-learned networks, there may be further layers creating further abstract features from outputs of pervious layers. The resulting machine-trained classifier is a matrix for inputs, convolution kernels, down-sampling, weighting, and/or combination to output a classification and/or probability of class membership. The deep machine-trained network includes two or more layers relating the input to the class.

Figure 2:
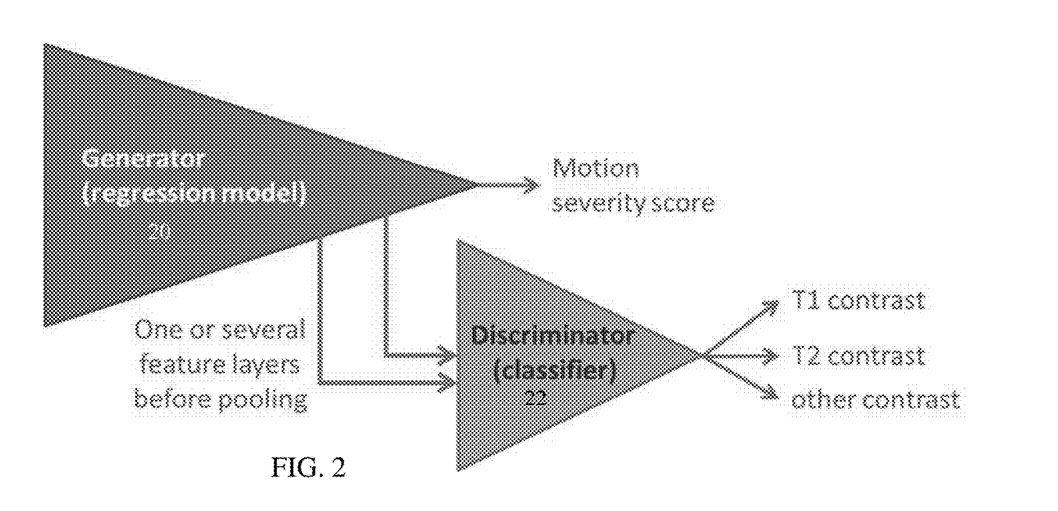
FIG. 2 illustrates an example adversarial network architecture for machine learning to detect motion.

FIG. 2 illustrates one embodiment of a machine learning model architecture. A generator 20 is defined to output a motion severity score given an input MR image. In the example of FIG. 2, the generator 20 is a regression model, such as formed by a neural network. Other types of generators may be used, such as a support vector machine. The generator 20 is designed to output the level of motion represented in the input MR image.

A discriminator 22 is defined to output a type of MR image or source of the MR image. In the example of FIG. 2, the discriminator 22 is a classifier, such as classifier provided by a neural network. Other types of discriminators 22 may be used, such as a support vector machine. Rather than detecting whether the output of the generator is accurate or not, the discriminator 22 provides adversarial feedback about whether the features of the generator 20 can be used to distinguish between different sources of the MR image. Contrast-independent, acquisition-independent, motion-related features are to be learned by the generator 20 based, in part, on feedback by the discriminator 22 about the ability to distinguish between the sources or classes of the MR image. The feedback is used to learn features in the generator 20 that make it difficult for the discriminator to distinguish the types of MR images (e.g., MR contrast or type of scanner).

In the example of FIG. 2, the sources are the type of MR contrast of the image input to the generator 20, such as being either T1, T2, or another MR contrast. In other embodiments, other class distinctions may be used for the discriminator 22. For example, the type of MR scanner or imager may be distinguished. The type may be the main magnet field strength (e.g., 2 T vs. 7 T), type of coil used on receive (e.g., whole body verses local coils), make and/or manufacture of the MR scanner, software version used to generate the MR image from the scanning, scanning settings, image processing settings, or other variation in MR imagers. A combination of classes may be used, such as T1 by a 2 T MR scanner, T1 by a 7 T MR scanner, T2 by a 2T MR scanner, or T2 by a 7 T MR scanner. A catch all "other" class may or may not be used.

In one embodiment, the generator 20 and the discriminator 22 are convolutional neural networks. For a regression model, the generator 20 is to learn to regress the motion score or level using convolution operations. The convolution kernels as defined by the architecture are learned by machine training. In a further embodiment, the automated motion assessment routine is based on a deep, convolutional neural network (e.g., a 2D DenseNet) realizing linear regression to a scalar quality score for each 2D input image. The generator 20 and/or discriminator 22 may be defined to include one or more DenseNets.

Figure 3:
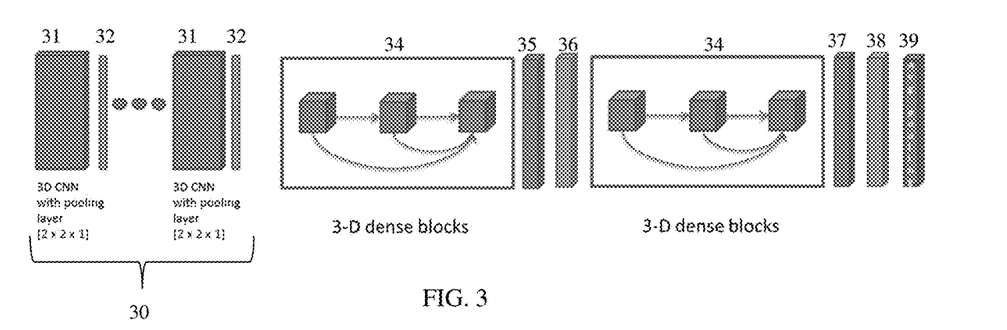
FIGS. 3 and 4 show different embodiments of network architectures for a regression model for detecting motion in MR.

FIG. 3 illustrates one embodiment of a network architecture of a neural network as the generator 20 for input of an anisotropic multi-slice 3D representation as the MR image. A cascade 30 of 3D convolution and pooling layers (31, 32) with anisotropic kernels and down sampling output isotropic features to 3D dense blocks 34. A 3D network FlexNet is used with adaptation for anisotropic data. The cascade of anisotropic kernels and dense blocks 34 is used for training an end-to-end model from input volumes to a quality score. Several layers of 3D convolutional neural networks 31 with uneven-sized convolution and pooling layers 32 with uneven down sampling generate feature maps that have similar sizes at all dimensions (e.g., isotropic). These features are cascaded to 3D dense blocks 34. The 3D dense blocks 34 include various layers, such as fully connected layers, with one or more skip connections to a final fully connected layer. The 3D dense blocks 34 output to a 3D convolution layer 35, followed by a 3D pooling layer 36. The 3D pooling layer 36 outputs to another 3D dense block 34, which outputs to a 3D convolution layer 37. The 3D convolution layer 37 outputs to a pooling layer 38, which outputs to an average pooling or other combination layer 39 for outputting the score as the level of motion. Additional, different, or fewer layers may be used. Based on input of examples of multi-slice, motion-corrupted volumes with associated volume quality indices, this network may be trained to output a score given an input multi-slice, motion-corrupted 3D representation of a patient.

Figure 4:
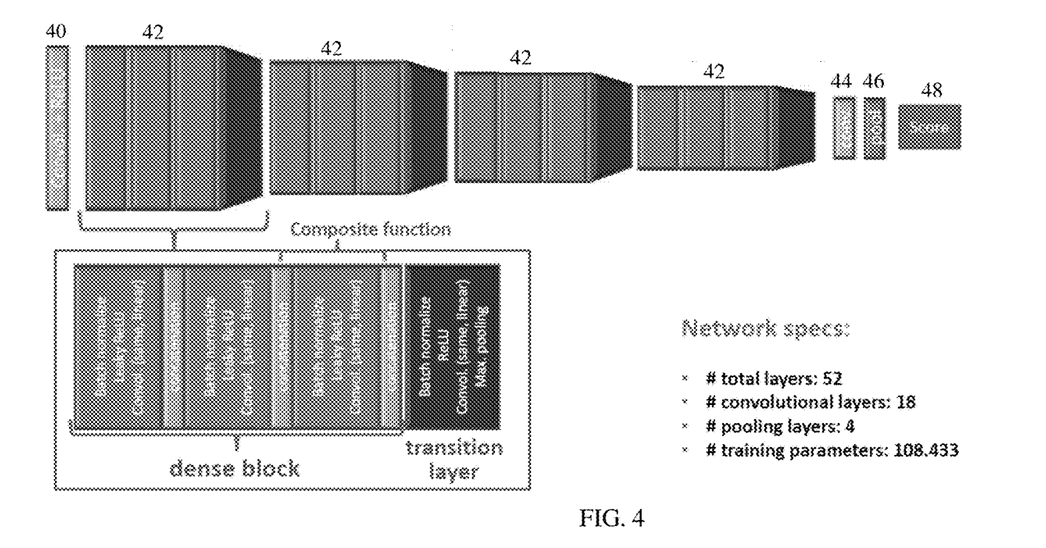

FIG. 4 illustrates another embodiment of a network architecture of a neural network as the generator 20. A convolutional plus ReLU layer 40 is provided for input of a 2D MR image. Four dense blocks and transition layers 42 are used in sequence or cascade. Each dense block is formed from a sequence of three pairs of batch normalization, leaky ReLU, and convolution layers with a concatenation layer, followed by a transition block of batch normalization, ReLU, convolution, and maximum pooling layers. In the dense block, skip connections are used so that values for features from different layers of the three pairs are feed directly to the respective transition block as well as or instead of feeding forward sequentially through the layers. The max pooling output after the last dense block 42 is provided to a convolution layer 44, which outputs to an average pooling layer 46. The average pooling layer 46 outputs the score. Other arrangements with additional, fewer, or different layers may be used. Different types of layers may be used. In the example of FIG. 4, 52 layers are provided, including 18 convolution layers, 4 pooling layers, and 108,433 training parameters. The training parameters are the learnable variables in the defined architecture, such as the values for convolution kernels, weights in connections, or other functions. Additional, different, or fewer training parameters may be used.

The discriminator 22 is a convolutional neural network defined to classify between classes of a source of the MR image separate from the motion severity score, such as the MR contrasts and/or types of MR scanners. In one embodiment, the discriminator 22 is an adversarial discriminator in the form of a 2D DenseNet, such as using one or more of the DenseNets 42 and/or dense blocks of FIG. 4 or FIG. 3. For example, two DenseNets 42 are provided in sequence. An output convolution layer (e.g., similar to layer 44 of FIG. 4) and a pooling layer (e.g., similar to layer 46 of FIG. 4) may be provided to output the class of the MR image source. Additional, different, or fewer layers may be used.

Referring to FIG. 2, the discriminator 22 is a branched network from the generator 20. The discriminator 22 is fed from one or more features generated by the regression model (i.e., generator 20) at one or more layers before pooling. Any number of features from the generator 20 may be fed to the discriminator 22, such as all of the features from a final layer before the pooling layer of the generator 20. By branching the discriminator 22 to receive values for features from the generator 20 instead of or in addition to the output score, the generator 20 may be adversarially trained to generate features for the regression model that are independent of the MR image contrast, MR scanner, or other non-motion MR image source.

Other neural networks or network architectures may be used. The network is trained to output a score of image quality. Any scoring may be used. For example, a numerical range representing quality is provided, such as 1-5 or 1-10, where the larger or smaller number represents highest quality or lowest motion artifact. As another example, alphanumeric classes are used, such as poor or good or such as poor, below average, average, good, or excellent.

The network is trained to assign the motion class (e.g., level of motion) based on the input MR image. For deep learning, the network learns features to extract from the input and learns to relate values of the features to the class (i.e., score, such as NRMSE). In additional or alternative embodiments, manually programmed features (e.g., Haar wavelets, steerable features, maximum detection) are extracted and used as the input feature vector.

In act 12 of FIG. 1, the defined architecture is machine trained. The generator (e.g., regression model) 20 and the discriminator 22 are machine trained. A machine performs the machine training based on the defined architecture and training data. Where neural networks are used, deep machine learning is performed.

The training data are sample MR images with corresponding ground truth. The MR images are from real, fully simulated, or partially simulated MR scans of a patient, phantom, or other object. The MR image is a multi-slice, volume, 2D, and/or another MR representation of the patient. The MR image is made available by or within medical scanners. The medical image or dataset is acquired by the medical MR scanners. Alternatively, the acquisition is from storage or memory, such as acquiring a previously created dataset from a picture archive communications system (PACS) or a medical records database. Acquisition may be through transmission over a network.

The MR images are acquired using one or more pulse sequences for scanning patients. Pulse sequences and corresponding sampling line orders are used to measure, resulting in k-space data. Helical (spiral), Cartesian, rotational (radial), or another scan pattern is used. The k-space data is then reconstructed. Fourier analysis or other methods are applied on k-space measurements to reconstruct the data from the k-space into a 3D object or 2D image space. Image processing, such as filtering, may be applied to the measurements in image space. Tens, hundreds, or thousands of MR images are acquired for training.

For the adversarial training, the ground truth includes the level of motion or motion artifact and source of the MR image (e.g., MR contrast or type of scanner used for the discriminator classification). The source of the MR image may be extracted from metadata, such as a header of the MR image from a PACS. Stored scan settings or characteristics may be accessed to obtain the source information, such as main coil field strength, pulse sequence, image processing applied, and/or software used in image formation. Expert annotation or labeling from image acquisition may be used to indicate the ground truth source class (e.g., MR contrast and/or type of scanner). The MR images of the training dataset are from different classes, such as T1, T2, and/or other MR contrasts.

For each 2D training image, a motion severity score is provided as a target score for the motion detection regression training. Suitable labels are obtained on clinical data through annotation by clinical experts or alternatively by employing synthetic images and computing a motion severity score. In the latter case, motion artifacts may be synthetically introduced into artifact-free images considering realistic patient movement patterns and the relevant k-space line order. The motion severity score of an image may be computed from a relevant metric (e.g., the Normalized Root Mean Squared Error (NRMSE), mean structural similarity index (M-SSIM) or multi-scale structural similarity index (MS-SSIM)), providing a measure for the similarity of the synthesized motion image and the original, motion-free image.

Data augmentation may be performed to increase robustness to variation in input image arrangement. For example, each sample MR image is rotated by 90°, 180°, 270°, and/or other angle, and/or flipped along horizontal, vertical, and/or other image axis. The size of the training set as well as variation in orientation of the input MR images is increased for training by the augmentation.

In machine learning, the machine learns to determine a score (e.g., difference) based on input of an MR image from a scan of an actual patient. The MR image is subjected to motion of the patient, so the machine is trained to output a score based on knowledge gleaned or regressed from the training data (e.g., determined errors of the training data). The training is based on results from the repetitions.

For adversarial training, the generator 20 and discriminator 22 are trained end-to-end or together. Iterative training may be used, where parameters for the generator 20 are trained or adjusted while the parameters of the discriminator 22 are held constant. The discriminator 22 is then trained while the parameters of the generator 20 are held constant. The process iteratively repeats. Alternatively, the parameters of both the generator 20 and discriminator 22 are updated in each iteration or at a same time.

The values of the trainable parameters are learned through optimization. Any optimization may be used, such as Adam or a gradient descent. For the optimization, a loss function is used to determine current success. For adversarial training, a combination loss is used. One loss is provided from the output of the generator and the ground truth motion level. Another loss is provided from the output of the discrimination and the ground truth source class. The losses are combined in use through iterative training and/or by calculation of a combined loss. For example, the overall training loss is given by:

$$L = L_{regres} + \lambda L_{discr}$$

where $L_{regres}$ is the generator regression loss, $L_{discr}$ is the discriminator loss, and is a user selectable or settable weight. In one embodiment, $L_{regres}$ is the L1-norm of regression targets values and scores, such as given by:

$$L_{regres}(y_r,\hat{y}_r)=|y_r-\hat{y}_r|$$

Where $\hat{y}_r$ is the predicted motion score and $y_r$ is the ground truth motion score. $L_{discr}$ is the cross entropy between target contrast classes and predicted classes, such as given by $$L_{discr}(y_c,\hat{y}_c)=\Sigma_{c=1}^{N}y_c \log \hat{y}_c,$$

where N is the number of classes, $\hat{y}_c$ is the predicted class score and $y_c$ is the ground truth class label. Other loss functions and/or combination functions may be used.

After creation, the machine-learned regression model (e.g., machine-learned network) includes one or more layers with values for various parameters, such as convolution kernels, down sampling weights, and/or connections. The values of the parameters and/or the network as trained are stored in act 14 of FIG. 1. The machine-learned regression model is stored in a memory, such as memory of the machine or the database with the examples. The machine-learned model may be transmitted to a different memory. The machine-learned model may be duplicated for application by other devices or machines, such as processors of MR scanners. The memories of MR scanners may store copies of the machine-learned regression model for application for specific patients, enabling a radiologist or other physician to determine whether to rely on an image or to scan again for diagnosis due to patient motion.

The discriminator is or is not also stored. The discriminator influences the features learned in the regression model through the combined used of the different loss functions and/or training adversarially. The discriminator results in the machine-learned regression model being different than would result from training without the discriminator but is not needed in application to benefit from the difference.

Figure 6:
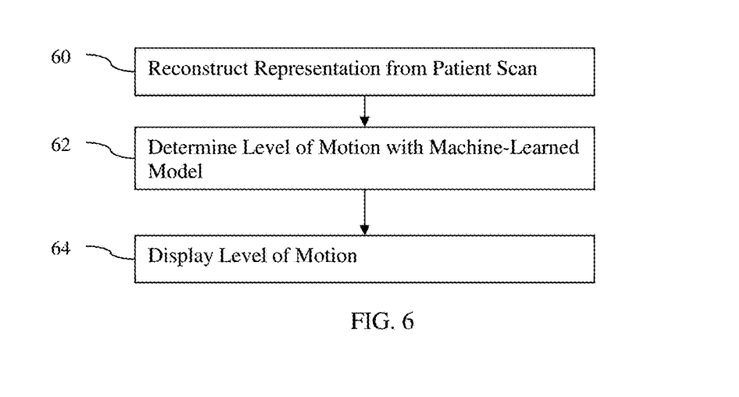
FIG. 6 is a flow chart diagram of one embodiment of a method for detecting motion with a machine-learned network.

FIG. 6 is a flow chart diagram of one embodiment of a method for detecting motion for an MR system. The stored machine-learned network (e.g., regression model) is applied to determine a score for a scan of a patient. An MR scan of the patient is performed, and the level of motion artifact from the resulting MR representation of that patient is determined by the machine-learned network.

An MR scanner scans the patient. The MR scanner, the system of FIG. 7, a server, computer, or other machine determines the level of motion and outputs the score to a display device.

Additional, different, or fewer acts may be provided. For example, the score is output to a memory (e.g., computerized medical record) instead of displayed in act 64. The acts are performed in the order shown (top to bottom), but other orders may be used.

In act 60, an MR scanner reconstructs an MR representation (e.g., 2D MR image) of a patient from an MR scan of the patient. The image is made available by or within the medical scanner. The medical image or dataset is acquired by the medical scanner using a scan protocol and corresponding pulse sequence. Alternatively, the acquisition is from storage or memory, such as acquiring a previously reconstructed dataset from a PACS. Acquisition may be through transmission over a network.

MR data representing a patient is acquired. MR data is acquired with an MR system or scanner. The data is acquired using a pulse sequence and line order for scanning a patient. Data representing an interior region of a patient is acquired. For MR, the MR data is k-space data. Fourier analysis is performed to reconstruct the data from the k-space into image space. The medical image represents tissue and/or bone structure of the patient. Alternatively, the medical image represents flow, velocity, or fluids within the patient. In other embodiments, the medical image represents both flow and structure.

The medical image represents a 2D or 3D region of the patient. For example, the medical image represents a plurality of slices of the patient. A 3D distribution of voxels based on the scan pattern or as interpolated to a 3D grid are provided, resulting in a plurality of stacked 2D images. A single 2D image may be generated or extracted in other embodiments. Values are provided for each of multiple locations distributed in two and/or three dimensions.

The image may include motion artifacts. The patient may move during the scan, such as moving their head. The result may be the appearance of noise, blur, or additional structures in the MR representation. Any level of artifact may exist. The amount of movement, interaction with the line order used, and/or other factors may contribute to different levels of motion artifact.

The MR representation is associated with a particular MR scanner and MR contrast. For example, the MR representation is generated or reconstructed as a T1 or T2 contrast image. Other contrast images may be used, such as spin echo, gradient echo, diffusion, perfusion, steady state free precession, or functional imaging. Different software versions and corresponding scan, reconstruction, and/or image processing settings may be used for the MR scanner. Different main magnet field strengths may be used for the MR scanner. The various options result in the MR representation being from a given class or type of MR scanner for a given MR contrast (e.g., T1).

In act 62, the MR scanner, server, workstation, computer, or other image processor determines a level of the motion artifact or another measure for the motion severity. The MR representation is input to the machine-learned network. In response to input, the machine-learned network outputs a measure of the level of the motion artifact.

In one embodiment, the machine-learned network is a deep convolutional neural network, such as one or more DenseNets. The machine-learned network has an architecture for dealing with the MR representation being from various MR image sources. For example, the machine-learned network is a deep convolutional neural network including convolutional and pooling layers. The deep convolutional neural network was trained with a discriminator connected to receive features of the deep convolutional neural network from before one of the pooling layers. Rather than training different networks for different MR contrasts or scanners, the machine-learned network was trained, using the discriminator and adversarial training, to detect motion regardless of the MR contrast and/or MR scanner used for the patient. By having trained with the discriminator trained to output contrast and/or scanner class, the machine-learned network is trained to create features for motion detection that are invariant or vary less due to differences in MR contrast and/or scanner used. The machine-learned network was trained with the discriminator using a combined loss, where the goal and corresponding optimization is, in part, to use features from which the discriminator cannot determine the MR contrast (e.g., train the discriminator to identify between T1 and T2 classes and train the generator to fool the discriminator) and/or cannot determine the class of MR scanners (e.g., train the discriminator to identify between one main magnet field strength and another main magnet field strength and train the generator to fool the discriminator).

The machine-learned network and the discriminator were trained with a combined loss. In a back and forth iterative fashion and/or with a combination objective function using losses from both in the optimization, the machine-learned network is trained to generate the level of motion regardless of the MR image source.

In addition to outputting the score, the machine-learned network may output additional information. A probability of class membership may be output (e.g., 75% likelihood of being good quality and 25% likelihood of being poor quality).

In act 64, the processor or MR scanner uses a display device to display the level of the motion. The quality or motion artifact score is transmitted over a network, through a communications interface, into memory or database (e.g., to a computerized patient medical record), or to a display.

In one embodiment, the image quality score ranges from 1 to 5, from best to worst. The score is based on the presence of motion artifacts. The extent and/or severity of motion artifacts throughout the MR representation may be reflected in the score. In other embodiments, the level of motion is detected as a binary—satisfactory or too much motion.

In another embodiment, the score is displayed with an image of the patient. A 2D image is generated by 3D rendering of the 3D representation. Alternatively, a 2D image from a 2D representation or from 3D (e.g., a 2D slice or interpolated from a plane in the volume) is displayed. The image quality score is displayed with the 2D image of the patient. The score is an annotation, part of a pop-up, in a report, or part of a notice.

The user or the medical scanner uses the quality score. A sufficiently good quality MR representation (e.g., score or value above or below a threshold) allows for diagnosis with lest risk for error. A poor-quality MR representation due to the combination of patient motion with the line order may not be sufficient for diagnosis, so the patient is scanned again. An automatic trigger based on score to scan by the MR scanner may be used. Alternatively, the user triggers the subsequent scan based on the score. Once the quality score for motion artifact in an MR image volume is predicted, the operator of the medical scanner or the medical scanner decides whether to rescan the patient. The score is used for a decision to use or not use the generated MR representation. The result is that a later physician review is more likely to have a useful image for diagnosis, and rescanning is avoided where possible. The score may be used to weight an amount of trust in diagnosis based on a MR representation reconstructed from a scan of the patient.

Figure 5:
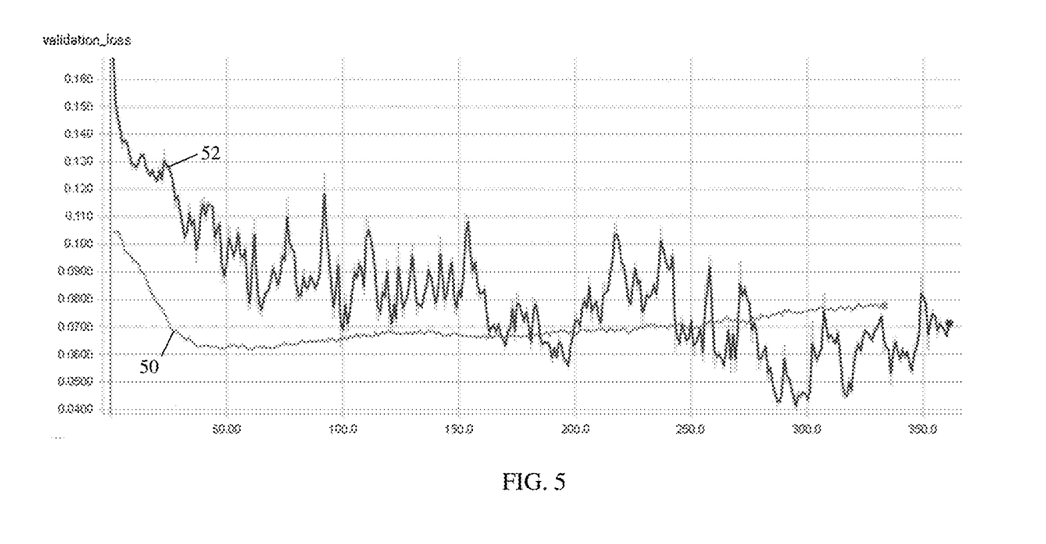
FIG. 5 shows example validation losses of a regression model for motion scoring trained adversarially and non-adversarially.

Referring to FIG. 5, the validation loss as a function of the number of epochs is shown for training without adversarial (flatter curve 50) and with adversarial (more variable curve 52). This validation is performed with a dataset that uses T2w MR images from a clinical 1.5T routine brain protocol on scanner types and magnetic field strength that were not present in the training data set. Due to the adversarial approach, the machine-learned network may have kept learning for a longer time (e.g., over a greater number of epochs) than the same network learning in a non-adversarial fashion. Training without the discriminator may result in over-fitting.

The adversarial approach may generalize better than non-adversarial. For example, training the generator of FIG. 4 with the discriminator and without the discriminator using a same set of training data and using a validation dataset that uses T2w MR images from a clinical 1.5T routine brain protocol on scanner types and magnetic field strength that were not present in the training data set, results in different areas under the curve (AUC) measurements. In one example, the AUC with adversarial training is 0.89, and the AUC with non-adversarial training is 0.81. The generalization of the model is stronger using adversarial training. The adversarial training approach delivers more contrast-invariant, automated motion assessment of MR images.

Figure 7:
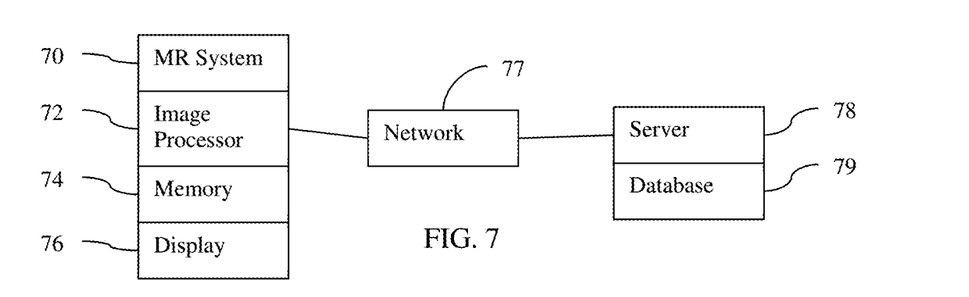
FIG. 7 is a block diagram of one embodiment of a magnetic resonance system for motion detection independent of scanner or contrast.

FIG. 7 shows one embodiment of an MR system for machine learning and/or for application of a machine-learned network. The MR system is for motion detection independent of scanner or contrast.

In FIG. 7, the MR system is distributed between the imaging system 70 and a remote server 78. In other embodiments, the MR system is just the server 78 or just the imaging system 70 without the network 77. In yet other embodiments, the MR system is a computer or workstation.

The system includes an imaging system 70, an image processor 72, a memory 74, a display 76, a communications network 77, a server 78, and a database 79. Additional, different, or fewer components may be provided. For example, network connections or interfaces are provided, such as for networking with a medical imaging network or data archival system. In another example, a user interface is provided. As another example, the server 78 and database 79 are not provided, or only the server 78 and database 79 are provided. In other examples, the server 78 connects through the network 77 with many imaging systems 70 and/or image processors 72.

The image processor 72, memory 74, and display 76 are part of the medical imaging system 70. Alternatively, the image processor 72, memory 74, and display 76 are part of an archival and/or image processing system, such as associated with a medical records database workstation or server, separate from the imaging system 70. In other embodiments, the image processor 72, memory 74, and display 76 are a personal computer, such as desktop or laptop, a workstation, or combinations thereof. The image processor 72, display 76, and memory 74 may be provided without other components for acquiring data by scanning a patient.

The imaging system 70, image processor 72, memory 74 and display 76 are provided at a same location. The location may be a same room, same building, or same facility. These devices are local relative to each other and are remote relative to the server 78. The server 78 is spaced apart by the network 77 by being in a different facility or by being in a different city, county, state, or country. The server 78 and database 79 are remote from the location of the image processor 72 and/or imaging system 70. The database 79 may be local to the image processor 72.

The imaging system 70 is a medical diagnostic imaging system or imager. The imaging system 70 is an MR imager or scanner. The MR imager includes a main field magnet, such as a cryomagnet, and gradient coils. A whole-body coil is provided for transmitting and/or receiving. Local coils may be used, such as for receiving electromagnetic energy emitted by atoms in response to pulses. Other processing components may be provided, such as for planning and generating transmit pulses for the coils based on the sequence and for receiving and processing the received k-space data based on a line order. The received k-space data is converted into object or image space data with Fourier or other processing. Further image processing may be provided, such as filtering, mapping, and/or formatting. The imaging system 70 is configured to generate MR representation representing the patient, such as a 2D MR image.

The memory 74 may be a graphics processing memory, a video random access memory, a random-access memory, system memory, cache memory, hard drive, optical media, magnetic media, flash drive, buffer, database, combinations thereof, or other now known or later developed memory device for storing data or video information. The memory 74 is part of the imaging system 70, part of a computer associated with the image processor 72, part of a database, part of another system, a picture archival memory, or a standalone device.

The memory 74 stores medical imaging data representing the patient, weights or values of parameters making up some of the layers of the machine-learned network, outputs from different layers, one or more machine-learned networks, MR representations, scores (e.g., error metric or differences relating an amount of motion artifact), and/or 2D images. The memory 74 may store data during processing for application and/or may store training data and data during processing for machine learning.

The memory 74 or other memory is alternatively or additionally a non-transitory computer readable storage medium storing data representing instructions executable by the programmed image processor 72 for training or use of a machine-learned model in medical MR imaging. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The image processor 72 is a general processor, central processing unit, control processor, graphics processor, digital signal processor, three-dimensional rendering processor, application specific integrated circuit, field programmable gate array, artificial intelligence processor, digital circuit, analog circuit, combinations thereof, or other now known or later developed device for machine training or applying a machine-learned network. The image processor 72 is a single device or multiple devices operating in serial, parallel, or separately. The image processor 72 may be a main processor of a computer, such as a laptop or desktop computer, or may be a processor for handling some tasks in a larger system, such as in the imaging system 70. The image processor 72 is configured by instructions, design, hardware, and/or software to perform the acts discussed herein.

The image processor 72 is configured to perform the acts discussed above for training or application. For training, the image processor 72 or another processor (e.g., the server 78) uses machine learning based on the stored and/or created training data and a defined network architecture. For application, the image processor 72 uses a stored machine-learned network. An MR representation of a given patient from the imaging system 70, the memory 74, or the database 79 is input to the machine-learned network, which outputs the score for motion artifact for that MR representation of that given patient. Motion associated with the MR representation or data is detected by application of the adversarially trained model. For example, a trained convolutional neural network was trained with a discriminator receive features from the neural network to adversarially classify the image into one of two or more image classes (e.g., type of MR contrast and/or type of MR system 70).

The image processor 72 is configured to transmit the score for quality due to motion in MR scanning over the network 77, to the display 76, or to the memory 74. The image processor 72 may be configured to generate a user interface for requesting and/or presenting the score with or without one or more images generated from the MR representation.

The display 76 is a monitor, LCD, projector, plasma display, CRT, printer, or other now known or later developed devise for outputting visual information. The display 76 receives images, graphics, text, quantities, or other information from the image processor 72, memory 74, imaging system 70, and/or server 78. One or more medical MR images are displayed. The MR images are of a region of the patient. The image includes an indication, such as a graphic or colorization, of the classification results, such as the score. The score may be displayed as the image without a medical MR image of the patient.

The network 77 is a local area, wide area, enterprise, another network, or combinations thereof. In one embodiment, the network 77 is, at least in part, the Internet. Using TCP/IP communications, the network 77 provides for communication between the image processor 72 and the server 78. Any format for communications may be used. In other embodiments, dedicated or direct communication is used.

The server 78 is a processor or group of processors. More than one server 78 may be provided. The server 78 is configured by hardware and/or software. In one embodiment, the server 78 performs machine learning with training data in the database 79. The machine-learned network is provided to the image processor 72 for application. The results of classification may be received from the image processor 72 for use in further training. Alternatively, the server 78 performs the application on an image received from the imaging system 70 and provides the score to the imaging system 70.

The database 79 is a memory, such as a bank of memories, for storing training data, such as MR representations reconstructed from simulation and respective scores. Weights or values of parameters of machine-learned network are stored in the database 79 and/or the memory 74.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for detecting motion of a patient in use of a magnetic resonance system, the method comprising:
    reconstructing a magnetic resonance representation of the patient from a magnetic resonance scan of the patient;

determining a level of the motion of the patient, the determining of the level being by a machine-learned network in response to input of the magnetic resonance representation to the machine-learned network, the machine-learned network having been trained adversarially with a discriminator, the discriminator having been trained to output (i) contrast class as a type of contrast, the contrast classes distinguishing between T1 and T2 as the type so that the output is T1 verses T2 as the contrast class, and/or (ii) scanner class as a type of magnetic resonance scanner; and displaying the level of the motion with an image from the magnetic resonance representation.

2. The method of claim 1 wherein reconstructing comprises generating a two-dimensional image as the magnetic resonance representation, and wherein displaying further comprises displaying the two-dimensional image.

3. The method of claim 1 wherein the magnetic resonance representation is generated as a T1 or T2 contrast image, and wherein determining comprises determining by the machine-learned network having been trained adversarially with the discriminator where the discriminator was trained to identify between the T1 and T2 contrast classes.

4. The method of claim 1 wherein the magnetic resonance representation is generated with a first main magnet field strength, and wherein determining comprises determining by the machine-learned network having been trained adversarially with the discriminator where the discriminator was trained to identify between field strength classes including the first main magnet field strength.

5. The method of claim 1 wherein the magnetic resonance representation is generated with a first class of magnetic resonance scanner, and wherein determining comprises determining by the machine-learned network having been trained adversarially with the discriminator where the discriminator was trained to identify between different classes of magnetic resonance scanners including the first class.

6. The method of claim 1 wherein determining comprises determining by the machine-learned network comprises a deep convolutional neural network.

7. The method of claim 6 wherein determining comprises determining by the deep convolutional neural network comprising a DenseNet.

8. The method of claim 6 wherein determining comprises determining by the deep convolutional neural network including a convolutional layer and a pooling layer, wherein the deep convolutional neural network was trained with the discriminator connected to receive features of the deep convolutional neural network from before the pooling layer.

9. The method of claim 1 wherein determining comprises determining by the machine-learned network and the discriminator having been trained with a combined loss.

10. A magnetic resonance system for motion detection independent of scanner or contrast, the magnetic resonance system comprising:

a magnetic resonance imager configured to generate magnetic resonance data representing a patient;

an image processor configured to detect motion by input of the magnetic resonance data to a machine-learned model, the machine-learned model having been trained adversarially with a discriminator configured to output a type of magnetic resonance contrast or type of magnetic resonance scanner based on labels, wherein the labels comprise (i) a type of magnetic resonance contrast, the type of magnetic resonance contrast distinguishing between T1 contrast, T2 contrast, and another magnetic resonance contrast, and/or (ii) a type of magnetic resonance scanner, the magnetic resonance imager being one of a plurality of types of magnetic resonance scanners; and a display configured to display information based on the detected motion.

11. The magnetic resonance system of claim 10 wherein the machine-learned model comprises a convolutional neural network having been trained with the discriminator receiving features from within the convolutional neural network.

* * * * *